United States Patent
Suzumura et al.

(10) Patent No.: US 8,604,096 B2
(45) Date of Patent: Dec. 10, 2013

(54) PHOTOSENSITIVE RESIN COMPOSITION, PHOTOSENSITIVE RESIN VARNISH, PHOTOSENSITIVE RESIN FILM, AND PHOTOSENSITIVE RESIN CURED PRODUCT

(75) Inventors: Kouji Suzumura, Ibaraki (JP); Ikue Mitani, Ibaraki (JP); Toshihiko Takasaki, Ibaraki (JP); Ikuo Mukai, Ibaraki (JP); Masami Ochiai, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/512,713

(22) PCT Filed: Nov. 29, 2010

(86) PCT No.: PCT/JP2010/071295
§ 371 (c)(1),
(2), (4) Date: Jun. 28, 2012

(87) PCT Pub. No.: WO2011/065546
PCT Pub. Date: Jun. 3, 2011

(65) Prior Publication Data
US 2012/0270963 A1    Oct. 25, 2012

(30) Foreign Application Priority Data
Nov. 30, 2009  (JP) ................. 2009-272814

(51) Int. Cl.
| | | |
|---|---|---|
| *C08F 2/46* | (2006.01) | |
| *C08F 2/50* | (2006.01) | |
| *C08B 37/00* | (2006.01) | |
| *B29C 71/04* | (2006.01) | |
| *C08J 3/28* | (2006.01) | |
| *C08G 61/04* | (2006.01) | |

(52) U.S. Cl.
USPC ........... 522/28; 522/7; 522/6; 522/71; 522/1; 520/1

(58) Field of Classification Search
USPC ................. 522/28, 7, 6, 71, 1; 520/1
See application file for complete search history.

(56) References Cited

U.S. PATENT DOCUMENTS 7,642,296 B2 * 1/2010 Husler et al. ............. 522/6
7,740,944 B2 * 6/2010 Komiya et al. ........... 428/423.3

FOREIGN PATENT DOCUMENTS

JP  2009-175210  * 8/2009

* cited by examiner

*Primary Examiner* — Ling Choi
*Assistant Examiner* — Jessica E Whiteley
(74) *Attorney, Agent, or Firm* — Antonelli, Terry, Stout & Kraus, LLP.

(57) ABSTRACT

Provided are a photosensitive resin composition capable of being quickly cured by light and providing an optically cured product which is excellent in a transparency in a visible light of 400 to 780 nm and a heat resistant reliability, a photosensitive resin varnish, a photosensitive resin film and a photosensitive resin cured product.
The photosensitive resin composition comprises (A) a polymerizable compound, (B) a polymerization initiator and (C) a hindered phenol base antioxidant, wherein (B-1) at least one selected from α-hydroxyacetophenone base photoinitiator and a glyoxy ester base photoinitiator and (B-2) a phosphine oxide base photoinitiator are contained as the component (B); the component (C) is a hindered phenol base antioxidant having in a molecule, at least one phenol group having each one group of a methyl group and a t-butyl group on the same aromatic ring; a content of the component (B) is 0.02 to 4.0 parts by mass based on 100 parts by mass of the component (A); and a content of the component (C) is 0.01 to 1 part by mass based on 100 parts by mass of the component (A).

21 Claims, 1 Drawing Sheet

PHOTOSENSITIVE RESIN COMPOSITION, PHOTOSENSITIVE RESIN VARNISH, PHOTOSENSITIVE RESIN FILM, AND PHOTOSENSITIVE RESIN CURED PRODUCT

BACKGROUND OF THE INVENTION

The present invention relates to a photosensitive resin composition, a photosensitive resin varnish, a photosensitive resin film and a photosensitive resin cured product, specifically to a photosensitive resin composition which has an excellent transparency and which is not colored by heating for long time, a photosensitive resin varnish, a photosensitive resin film and a photosensitive resin cured product.

RELATED ART

A light source for illumination which is paid attentions in recent years includes LED. LED has a high luminance and a low power consumption in combination and therefore is used recently in various mobile equipments such as cellular phones, personal digital assistants (PDA), portable game equipments, portable audios and the like in many cases.

Further, the above equipments are required to be further reduced in a power consumption and a weight, and therefore illumination carried out by using devices such as optical waveguides, waveguides and the like as devices which apply illumination more efficiently is paid attentions.

Among them, devices prepared by using polymers are excellent particularly in a processability and can have a flexible structure, and therefore polymer optical waveguides and polymer waveguides are considered to be most suited to the above applications.

A high transparency (low optical propagation loss) in a visible light region of 400 to 780 nm is required to the above devices for illumination from the viewpoint of use environment of equipments to which the devices are applied, and vinyl polymers represented by alicyclic polyolefins, (meth)acryl polymers and the like have so far been used as materials suited to the above applications. A large part of them is used mainly for applications such as prisms, lenses, optical waveguides and the like and has a very high transparency. However, they are used mainly for melt molding applications such as injection molding, extrusion molding and the like, and therefore the problems that they can not be used for members having a small-sized and complicated form and very thin members and that they are inferior in a heat resistant reliability since they are thermoplastic resins have been involved therein.

On the other hand, a cast molding method, an imprint method, a stamp method, a transfer method and the like are considered as a processing technique by which complicated members can be formed. A liquid provided with a photosensitivity is injected into a die having an optional form, or the liquid is allowed to flow and spread and then pressed by a metal die or a material which is processed into a film form or a sheet form is pressed by a metal die, and then it is irradiated with light, whereby it can be three-dimensionally cross-linked and insolubilized to readily form members having a complicated form.

To be more specific, a sheet-like resin, a film-like resin or a liquid resin which is provided with a photosensitivity is irradiated with light via a pattern mask to thereby three-dimensionally cross-link and insolubilize only optional parts, and then non-irradiated parts are dissolved by a solvent and removed, whereby members having a complicated form can readily be formed.

Further, the above members are covered with a material having a low refractive index or air to thereby make it possible to propagate more efficiently light. Then, materials which are provided with a photosensitivity and have good optical characteristics are investigated (refer to, for example, patent documents 1 to 4).

In the materials described above, a good propagation characteristic is shown in a case of a laser beam of a long wavelength side (for example, 850 nm), but a photoinitiator is restricted to a large extent in order to secure a transparency of a visible light. Further, when an aromatic structure is introduced thereinto in order to improve the refractive index and the heat resistance, a light wavelength which can contribute to optical curing is limited by UV absorption of the aromatic group to result in bringing about the problems that the UV curing property is inferior and that the heat resistant reliability is inferior due to heat degradation of photoinitiator decomposed products.

Further, a photosensitive resin composition which comprises a vinyl polymer having at least one chain-polymerizable functional group in a molecule, a polymerizable compound and at least one of 2-[2-oxo-2-phenylacetoxyethoxy]-ethyl oxyphenylacetate, 2-(2-hydroxyethoxy)ethyl oxyphenyl-acetate and oligo{2-hydrox-2-methyl-1-[4-(1-methylvinyl)-phenyl]}propanone as a polymerization initiator and in which a content of the polymerization initiator is controlled to a specific range has been proposed as a photosensitive resin composition having a good propagation loss in a visible light region by the present inventors (patent document 5).

However, while the material disclosed in the patent document 5 has an excellent propagation characteristic in a visible light region, a transparency and a heat resistant reliability of the cured product prepared have not necessarily been sufficiently high.

CITATION LIST

Patent Literature

Patent document 1: Japanese Patent Application Laid-Open No. 128342/1994
Patent document 2: Japanese Patent Application Laid-Open No. 288206/2001
Patent document 3: Japanese Patent Application Laid-Open No. 195079/2003
Patent document 4: Japanese Patent Application Laid-Open No. 63288/2006
Patent document 5: International Patent Publication WO 2009/66638

DISCLOSURE OF THE INVENTION

The present invention has been made in order to solve the problems described above, and an object of the present invention is to provide a photosensitive resin composition capable of being quickly cured by light and providing an optically cured product which is excellent in a transparency in a visible light of 400 to 780 nm and a heat resistant reliability and a cured product thereof, a photosensitive resin film and a cured product thereof and an optical waveguide prepared by using them.

Intense investigations repeated by the present inventors have resulted in finding that the problems described above can be solved by using a specific photoinitiator, and they have come to complete the present invention.

That is, the present invention provides:

(1) a photosensitive resin composition comprising (A) a polymerizable compound, (B) a polymerization initiator and (C) a hindered phenol base antioxidant, wherein (B-1) at least one selected from α-hydroxyacetophenone base photoinitiator and a glyoxy ester base photoinitiator and (B-2) a phosphine oxide base photoinitiator are contained as the component (B); the component (C) is a hindered phenol base antioxidant having in a molecule, at least one phenol group having each one group of a methyl group and a t-butyl group on the same aromatic ring; a content of the component (B) is 0.02 to 4.0 parts by mass based on 100 parts by mass of the component (A); and a content of the component (C) is 0.01 to 1 part by mass based on 100 parts by mass of the component (A), (2) a photosensitive resin varnish characterized by containing the photosensitive resin composition according to the above item (1), (3) a photosensitive resin film prepared by coating the photosensitive resin varnish according to the above item (2) on a base film and drying it and (4) a photosensitive resin cured product obtained by irradiating the photosensitive resin composition according to the above item (1) or the photosensitive resin varnish according to the above item (2) with a UV ray to cure it.

The present invention makes it possible to provide a photosensitive resin composition which can be cured by light and which has a good transparency in a visible light region and a good heat resistant reliability and further provide a photosensitive resin varnish, a photosensitive resin film and a photosensitive resin cured product.

BEST MODE FOR CARRYING OUT THE INVENTION

The photosensitive resin composition of the present invention is a photosensitive resin composition comprising (A) a polymerizable compound, (B) a specific polymerization initiator and (C) a hindered phenol base antioxidant.

The photosensitive resin composition of the present invention is characterized by containing (B-1) at least one selected from α-hydroxyacetophenone base photoinitiator and a glyoxy ester base photoinitiator and (B-2) a phosphine oxide base photoinitiator as the polymerization initiator (B). A cured product which is less colored and has a high transparency in a visible light region is obtained by using the above specific polymerization initiator (B).

The α-hydroxyacetophenone base photoinitiator which is the component (B-1) includes 1-hydroxy-cyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, 2-hydroxy-1-(4-(4-(2-hydroxy-3,5,2-methyl-propionyl)-benzyl)-phenyl)-2-methylpropane-1-one and the like.

Also, the glyoxy ester base photoinitiator includes 2-[2-oxo-2-phenylacetoxyethoxy]ethyl oxyphenylacetate, 2-(2-hydroxyethoxy)ethyl oxyphenylacetate, a mixture thereof and the like.

Among them, 1-hydroxy-cyclohexyl phenyl ketone, 2-[2-oxo-2-phenylacetoxyethoxy]ethyl oxyphenylacetate, 2-(2-hydroxyethoxy)ethyl oxyphenylacetate and a mixture thereof are particularly preferably selected from the viewpoints that the cured product is less colored and has a high transparency in a visible light region.

Next, the phosphine oxide base photoinitiator which is the component (B-2) includes 2,4,6-trimethylbenzoyl-diphenylphosphione oxide, 2,4,6-trimethylbenzoyl-phenylphosphione oxide, a mixture thereof and the like. Use of the above photoinitiators not only makes it possible to cure the resin composition at a smaller light dose but also provides the cured product obtained with an excellent transparency in a visible light region since they have a photobleaching ability. Among them, 2,4,6-trimethylbenzoyl-diphenylphosphione oxide is particularly preferred since it has an excellent transparency in a visible light region and is provided with a high curing property.

Photobleaching means optical discoloration. Usually, when carrying out photo-curing by a UV ray, a photoinitiator is liable to absorb a UV ray on a surface of the resin composition, and therefore a UV ray is less liable to reach up to a deep part of the resin composition when the photoinitiator of the component (B-1) is used, so that curing reaction is less liable to proceed there as compared with a surface of the resin composition.

On the other hand, since the phosphine oxide base photoinitiator which is the component (B-2) has the property that it is decomposed by absorbing a UV ray, a UV ray is liable to reach a deep part of the resin composition as compared with a case in which the photoinitiator of the component (B-1) is used, and curing reaction is liable to proceed up to the deep part even at a smaller use amount of the photoinitiator.

Accordingly, combined use of the photoinitiator of the component (B-1) and the phosphine oxide base photoinitiator which is the component (B-2) makes it possible to allow the contradictory problems to be consistent, wherein the satisfactory curing reaction is brought about even at a small use amount of the photoinitiator to reduce uneven curing between the surface and the deep part, and the coloring is reduced by decreasing a use amount of the photoinitiator.

A content of the component (B) is 0.02 to 4.0 parts by mass based on 100 parts by mass of the component (A). If it is less than 0.02 part by mass, the curing reaction does not proceed sufficiently by irradiation with light, and if it exceeds 4.0 parts by mass, influence of the coloring originating in the component (B) is increased to result in reducing the transparency in a visible light region and elevating a loss of the material in the waveguide.

Also, a suitable range in a content of the component (B) is varied according to the use forms of the above resin composition. For example, when the resin composition is used for a light guiding film, the component (B) is used preferably at a relatively small amount in order to secure the transparency. A content of the component (B) at which the transparency is consistent with the curing property falls in range of preferably 0.03 to 2.0 parts by mass, more preferably 0.05 to 1.0 part by mass.

In particular, when the resin composition is used for a light guiding film, a content of the component (B-1) is preferably 0.01 to 0.7 part by mass, and a content of the component (B-2) is preferably 0.01 to 0.6 part by mass each based on 100 parts by mass of the component (A). If a content of the component (B-1) is 0.01 part by mass or more, the sufficiently high optical curing property is obtained, and if it is 0.7 part by mass or less, the good heat resistant reliability is obtained to prevent the problem of coloring. Also, if a content of the component (B-2) is 0.01 part by mass or more, the sufficiently high optical curing property is obtained, and if it is 0.6 part by mass or less, photobleaching is brought about in optical curing to prevent the cured product from being colored, so that it is preferred.

On the other hand, when the photosensitive resin composition of the present invention is used in a large film thickness, it is less liable to be cured than in a case of the film, and therefore a content of the component (B) has to be increased. To be specific, the content falls in a range of preferably 0.05 to 2.0 parts by mass, more preferably 0.01 to 1.0 part by mass.

When a component (D) described later is contained in the resin composition, a content of the component (B) is shown by parts by mass assuming that a total amount of the component (A) and the component (D) is set to 100 parts by mass.

Next, the photosensitive resin composition of the present invention is characterized by being blended with (C) a specific hindered phenol base antioxidant. To be more specific, it is a hindered phenol base antioxidant having in a molecule, at least one phenol group having each one group of a methyl group and a t-butyl group on the same aromatic ring, and it is particularly preferably a compound represented by the following formula (1). Use of these compounds makes it possible to enhance the heat resistant reliability and improves the curing property since inhibition of the polymerization in the optical curing is small. Further, an irradiation dose of a UV ray and the like necessary for the curing is decreased, and therefore the productivity is increased.

(1)

wherein X is either of divalent groups shown below:

A content of the component (C) in the present invention falls in range of 0.01 to 1.0 part by mass based on 100 parts by mass of the component (A). If a content of the component (C) is less than 0.01 part by mass, the heat resistant reliability is inferior, and if it exceeds 1.0 part by mass, inhibition of the polymerization in the optical curing is increased to make the curing unsatisfactory. Further, a visible light in a region of 500 to 700 nm is absorbed to change a color resulting from the used visible light source in a certain case. Increasing an irradiation dose of a UV ray in order to secure the curing property leads to deterioration of the productivity and therefore is not preferred. From the viewpoints described above, a content of the component (C) falls in range of more preferably 0.05 to 0.5 part by mass.

When the component (D) described later is contained in the resin composition, a content of the component (C) is shown by parts by mass assuming that a total amount of the component (A) and the component (D) is set to 100 parts by mass.

The component (A) used in the present invention shall be explained below.

The polymerizable compound of the component (A) shall not specifically be restricted as long as it is polymerized by heating or irradiating with a UV ray and the like, and it includes suitably, for example, compounds having a polymerizable substituent such as an ethylenically unsaturated group and the like. In particular, preferred are compounds which have in a molecule, at least one functional group capable of being subjected to chain polymerization by radicals generated by irradiating a photoinitiator with light and which do not absorb light in a range of 400 to 780 nm. Also, as far as the properties thereof are concerned, any of the solid, semi-solid and liquid compounds can be used.

To be specific, it includes (meth)acrylates, halogenated vinylidene, vinyl ether, vinyl ester, vinylpyridine, vinylamide, arylated vinyl and the like, and among them, it is preferably (meth)acrylates and arylated vinyl from the viewpoint of the transparency. Any of monofunctional (meth)acrylates and multifunctional (meth)acrylates having two or more functionality can be used as the (meth)acrylates.

The monofunctional (meth)acrylate includes, for example, aliphatic (meth)acrylates such as methyl(meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth) acrylate, nonyl (meth)acrylate, decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, stearyl (meth)acrylate, behenyl (meth)acrylate, 2-hydroxyethyl (meth)acrylate, 2-hydroxypropyl (meth)acrylate, 3-chloro-2-hydroxypropyl (meth) acrylate, 2-hydroxybutyl (meth)acrylate, methoxypolyethylene glycol (meth)acrylate, ethoxypolyethylene glycol (meth) acrylate, methoxypolypropylene glycol (meth)acrylate, ethoxypolypropylene glycol (meth)acrylate, mono(2-(meth) acryloyloxyethyl)succinate and the like; alicyclic (meth) acrylates such as cyclopentyl (meth)acrylate, cyclohexyl (meth)acrylate, cyclopentyl (meth)acrylate, dicyclopentanyl (meth)acrylate, dicycopentenyl (meth)acrylate, isobornyl (meth)acrylate, mono(2-(meth)acryloyloxyethyl) tetrahydrophthalate, mono(2-(meth)acryloyloxyethyl) hexahydrophthalate and the like; aromatic (meth)acrylates such as benzyl (meth)acrylate, phenyl (meth)acrylate, o-biphenyl (meth) acrylate, 1-naphthyl (meth)acrylate, 2-naphthyl (meth) acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxypolyethylene glycol (meth)acrylate, nonylphenoxypolyethylene glycol (meth) acrylate, phenoxypolypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, 2-hydroxy-3-(2-naphthoxy)propyl (meth)acrylate and the like; and heterocyclic (meth)acrylates such as 2-tetrahydrofurfuryl (meth)acrylate, N-(meth)acryloyloxyethylhexahydrophthalimide, 2-(meth)acryloyloxyethyl-N-carbazole and the like and caprolactone-modified products thereof.

Further, it includes compounds having an ethylenically unsaturated group and a carboxyl group such as mono(2-(meth)acryloyloxyethyl) succinate, mono(2-(meth)acryloyloxyethyl) phthalate, mono(2-(meth)acryloyloxyethyl) isophthalate, mono(2-(meth)acryloyloxyethyl) terephthalate, mono(2-(meth)acryloyloxyethyl) tetrahydrophthalate, mono (2-(meth)acryloyloxyethyl) hexahydrophthalate, mono(2-(meth)acryloyloxyethyl) hexahydroisophthalate, mono(2-(meth)acryloyloxyethyl) hexahydroterephthalate, ω-carboxy-polycaprolactone mono(meth)acrylate, 3-vinyl benzoate, 4-vinyl benzoate, (meth)acrylic acid, maleic acid, fumaric acid, crotonic acid, itaconic acid, citraconic acid, mesaconic acid, cinnamic acid and the like; compounds having an ethylenically unsaturated group and an epoxy group such as glycidyl (meth)acrylate, α-ethylglycidyl (meth)acrylate, α-propylglycidyl (meth)acrylate, α-butylglycidyl (meth)acrylate, 2-methylglycidyl (meth)acrylate, 2-ethylglycidyl (meth)acrylate, 2-propylglycidyl (meth)acrylate, 3,4-epoxybutyl (meth)acrylate, 3,4-epoxyheptyl (meth)acrylate, α-ethyl-6,7-epoxyheptyl (meth)acrylate, 3,4-epoxycyclohexylmethyl (meth)acrylate, o-vinylbenzyl glycidyl ether, m-vinylbenzyl glycidyl ether, p-vinylbenzyl glycidyl ether, and the like; compounds having an ethylenically unsaturated group and an oxetanyl group such as (2-ethyl-2-oxetanyl) methyl (meth)acrylate, (2-methyl-2-oxetanyl)methyl (meth) acrylate, 2-(2-ethyl-2-oxetanyl)ethyl (meth)acrylate, 2-(2-methyl-2-oxetanyl)ethyl (meth)acrylate, 3-(2-ethyl-2-oxetanyl)propyl (meth)acrylate, 3-(2-methyl-2-oxetanyl) propyl(meth)acrylate and the like; compounds having an ethylenically unsaturated group and an isocyanate group such as 2-(meth)acryloyloxyethyl isocyanate and the like; and compounds having an ethylenically unsaturated group and a hydroxyl group such as 2-hydroxyethyl (meth)acrylate, 2-hydroxypropyl (meth)acrylate, 3-chloro-2-hydroxypropyl (meth)acrylate, 2-hydroxybutyl (meth)acrylate and the like.

Among the monofunctional compounds described above, the compounds having at least one group selected from a hydroxyl group and a tetrahydrofurfuryl group in a molecule are more preferred since they not only reduce the viscosity but also improve the curing property, and hydroxyalkyl acrylates and tetrahydrofurfuryl (meth)acrylate are particularly preferred since they provide the excellent heat resistance.

The difunctional (meth)acrylate includes, for example, aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecanedimethanol (meth)acrylate, ethoxylated 2-methyl-1,3-propanediol (meth)acrylate and the like; alicyclic (meth)acrylates such as cyclohexanedimethanol (meth)acrylate, ethoxylated cyclohexanedimethanol (meth)acrylate, propoxylated cyclohexanedimethanol (meth)acrylate, ethoxylated propoxylated cyclohexanedimethanol (meth)acrylate, tricyclodecanedimethanol (meth)acrylate, ethoxylated tricyclodecanedimethanol (meth)acrylate, propoxylated tricyclodecanedimethanol (meth)acrylate, ethoxylated propoxylated tricyclodecanedimethanol (meth)acrylate, ethoxylated hydrogenated bisphenol A di(meth)acrylate, propoxylated hydrogenated bisphenol A di(meth)acrylate, ethoxylated propoxylated hydrogenated bisphenol A di(meth)acrylate, ethoxylated hydrogenated bisphenol F di(meth)acrylate, propoxylated hydrogenated bisphenol F di(meth)acrylate, ethoxylated propoxylated hydrogenated bisphenol F di(meth)acrylate and the like; aromatic (meth)acrylates such as ethoxylated bisphenol A di(meth)acrylate, propoxylated bisphenol A di(meth)acrylate, ethoxylated propoxylated bisphenol A di(meth)acrylate, ethoxylated bisphenol F di(meth)acrylate, propoxylated bisphenol F di(meth)acrylate, ethoxylated propoxylated bisphenol F di(meth)acrylate, ethoxylated bisphenol AF di(meth)acrylate, propoxylated bisphenol AF di(meth)acrylate, ethoxylated propoxylated bisphenol AF di(meth)acrylate, ethoxylated fluorene type di(meth)acrylate, propoxylated fluorene type di(meth)acrylate, ethoxylated propoxylated fluorene type di(meth)acrylate and the like; heterocyclic (meth)acrylates such as ethoxylated isocyanurate di(meth)acrylate, propoxylated isocyanurate di(meth)acrylate, ethoxylated propoxylated isocyanurate di(meth)acrylate and the like; caprolactone-modified compounds thereof; aliphatic epoxy (meth)acrylates such as neopentylglycol type epoxy (meth)acrylate, alicyclic epoxy (meth)acrylates such as cyclohexanedimethanol type epoxy (meth)acrylate, hydrogenated bisphenol A type epoxy (meth) acrylate, hydrogenated bisphenol F type epoxy (meth)acrylate and the like; and aromatic epoxy (meth)acrylates such as resorcinol type epoxy (meth)acrylate, bisphenol A type epoxy (meth)acrylate, bisphenol F type epoxy (meth)acrylate, bisphenol AF type epoxy (meth)acrylate, fluorene type epoxy (meth)acrylate and the like.

The trifunctional or more (meth)acrylate includes, for example, aliphatic (meth)acrylates such as trimethylolpropane tri(meth)acrylate, ethoxylated trimethylolpropane tri (meth)acrylate, propoxylated trimethylolpropane tri(meth) acrylate, ethoxylated propoxylated trimethylolpropane tri (meth)acrylate, pentaerythritol tri(meth)acrylate, ethoxylated pentaerythritol tri(meth)acrylate, propoxylated pentaerythritol tri(meth)acrylate, ethoxylated propoxylated pentaerythritol tri(meth)acrylate, pentaerythritol tetra(meth) acrylate, ethoxylated pentaerythritol tetra(meth)acrylate, propoxylated pentaerythritol tetra(meth)acrylate, ethoxylated propoxylated pentaerythritol (meth)acrylate, ditrimethylolpropane tetra(meth)acrylate, dipentaerythritol hexa (meth)acrylate and the like; heterocyclic (meth)acrylates such as ethoxylated isocyanurate tri(meth)acrylate, propoxylated isocyanurate tri(meth)acrylate, ethoxylated propoxylated isocyanurate tri(meth)acrylate and the like; caprolactone-modified compounds thereof; and aromatic epoxy (meth)acrylates such as phenol novolak type epoxy (meth) acrylate, cresol novolak type epoxy (meth)acrylate and the like Among the compounds described above, at least one selected from the difunctional or more polymerizable compounds is preferably contained. Use of the multifunctional polymerizable compounds allows three-dimensional crosslinking to proceed and makes it possible to obtain the cured product having less change of a form against heat. Also, the monofunctional polymerizable compound lowers a viscosity of the photosensitive resin composition and makes handling thereof easier, and therefore it is suitably mixed if necessary.

The above compounds can be used alone or in combination of two or more kinds thereof, and they can be used as well in combination with other polymerizable compounds.

When the commercially available products of the above compounds are used, they can be used as they are, but they may be used after refined, if necessary, by subjecting them to distillation, column separation and the like before used.

Usually, the component (A) is produced by a dehydrating esterification method in many cases, and used in many cases are a sulfonic acid base catalyst as the reaction catalyst and benzene and toluene as the reaction solvent. Sulfur components and aromatic components which are a cause of coloring are contained as impurities in the polymerizable compound (A) produced by the above method.

To be more specific, the contents of p-toluenesulfonic acid and alkali metal salts of p-toluenesulfonic acid obtained by neutralizing p-toluenesulfonic acid which are contained as impurities are preferably 40 ppm by mass or less based on a whole amount of the component (A). If the contents of the above impurities are 40 ppm by mass or less, the cured product which is transparent in a visible light region and which is excellent in a heat resistant reliability can be obtained. On the other hand, if the contents of p-toluenesulfonic acid and the alkali metal salts of p-toluenesulfonic acid exceed 40 ppm by mass, the heat resistant reliability is reduced, and coloring of the cured product is caused in a certain case. Accordingly, both cases are not preferred. From the above results, the contents of the impurities described above are more preferably 20 ppm by mass or less based on a whole amount of the component (A).

In the present invention, a transesterification method is preferably used as a production method for the component (A). A neutral catalyst is used as the reaction catalyst, and lower (meth)acrylic ester is used as the solvent, so that the foregoing impurities which are a cause of coloring are not contained.

Further, the polymerizable compound of the component (A) includes suitably a compound represented by the following Formula (2) or (4). The above compound has an excellent transparency in a visible light region and is excellent in a heat resistance since it has an aromatic group, and it is inexpensive, so that it is preferred.

(2)

In Formula (2), $R_1$ and $R_2$ each are a hydrogen atom or methyl. $R_3$ is a group represented by the following Formula (3):

(3)

In Formula (3), a+b falls in a range of preferably 2 to 50 in terms of the flexibility. From the above viewpoint, a+b falls in a range of more preferably 4 to 40, particularly preferably 8 to 35. $R_4$ and $R_5$ each are a hydrogen atom or methyl. Also, $R_6$ is any of divalent groups represented by the following Formulas:

(4)

In Formula (4), $R_7$ and $R_8$ each are a hydrogen atom or methyl. Also, $R_9$ is a group represented by the following Formula (5), (6) or (7):

(5)

(6)

(7)

In Formulas (5), (6) and (7), $R_{10}$ to $R_{15}$ each are a hydrogen atom or methyl. Also, c is an average value and falls in a range of 1 to 30. The terms d and e are average values as well and fall in a range of 1 to 15 respectively. Further, f, g and h each are average values and fall in a range of 1 to 10.

Also, a compound containing at least one selected from the group consisting of an alicyclic structure, an allyl group, an aryloxy group and an aralkyl group and an ethylenically unsaturated group in a molecule is also suitably used as the polymerizable compound of the component (A) from the viewpoint of the heat resistance. To be specific, it includes (meth)acrylate or N-vinylcarbazole containing at least one selected from the group consisting of an alicyclic structure, an aryl group, an aryloxy group and an aralkyl group. In this connection, the aryl group means, for example, an aromatic hydrocarbon group such as a phenyl group, a naphthyl group and the like and an aromatic heterocyclic group such as a carbazole group and the like.

In the photosensitive resin composition of the present invention, the component (A) can be used alone as the resin component, and the component (D) described later can be blended. When blending the component (D), a content of the component (A) is preferably 15% by mass or more based on a total amount of the component (A) and the component (D). If it is 15% by mass or more, the resin composition is readily cured while forming a chemical bond with a polymer chain of the component (D).

When the photosensitive resin composition of the present invention is used for a light guiding film, the resin composition contains preferably the component (D), and a blend amount of the component (A) in the above case is preferably 90% by mass or less, more preferably 30 to 80% by mass from the viewpoint that a film strength and a flexibility of the cured film are satisfactory.

Next, the component (D) used in the present invention shall be explained in detail. The component (D) is a vinyl polymer having in a molecule, at least one functional group which can be subjected to chain polymerization, and a weight average molecular weight thereof falls preferably in a range of 5,000 to 2,000,000. Further, a glass transition temperature thereof falls in a range of preferably 30 to 100° C., and an OH value thereof falls in a range of preferably 10 to 120 mg KOH/g. If a weight average molecular weight of the vinyl polymer is 5,000 or more, the film is readily formed, and it is preferred. On the other hand, it is preferably 2,000,000 or less from the viewpoint of easiness in synthesis of the vinyl polymer. Also, if a glass transition temperature thereof is 30° C. or higher, the photosensitive resin cured product obtained is provided with a hardness of a certain degree or higher, and the cured product is not deformed in a high temperature and high humidity reliability test, so that it is preferred. On the other hand, if a glass transition temperature thereof is 100° C. or lower, the photosensitive resin cured product is provided with a sufficiently high strength, and it is not fragile. Further, if an OH value thereof is 10 mg KOH/g or more, a compatibility of the vinyl polymer with the polymerizable compound which is the component (A) is sufficiently obtained, and the transparent photosensitive resin cured product is obtained, so that it is preferred. On the other hand, if an OH value thereof is 120 mg KOH/g or less, a moisture absorbing property of the vinyl polymer is not too high, and whitening is not brought about by moisture absorption in the high temperature and high humidity test, so that it is preferred.

The component (D) is not an essential component in the present invention, and it is suitably mixed according to the use applications of the photosensitive resin composition of the present invention. Also, the weight average molecular weight in the present invention is a value measured by gel permeation chromatography (GPC) and reduced to standard polystyrene.

The component (D) described above shall not be restricted in the structure and the polymerization method of the vinyl polymer and the kind of the polymerization reaction thereof as long as a molecular weight, an OH value and a glass transition temperature thereof fall in the preferred ranges described above. For example, a solution polymerization method, a suspension polymerization method, an emulsion polymerization method, a bulk polymerization method, a gas phase polymerization method and the like are used as the polymerization method, and radical polymerization, cationic polymerization, anionic polymerization, coordination polymerization and the like can be used as the polymerization reaction.

A monomer for forming the component (D) described above includes various monomers, and it includes, for example, aliphatic (meth)acrylates such as methyl(meth)acrylate, ethyl(meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth)acrylate, nonyl (meth)acrylate, decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, stearyl (meth)acrylate, behenyl (meth)acrylate, 2-hydroxyethyl (meth)acrylate, 2-hydroxypropyl (meth)acrylate, 3-chloro-2-hydroxypropyl (meth)acrylate, 2-hydroxybutyl (meth)acrylate, methoxypolyethylene glycol (meth)acrylate, ethoxypolyethylene glycol (meth)acrylate, methoxypolypropylene glycol (meth)acrylate, ethoxypolypropylene glycol (meth)acrylate, mono(2-(meth) acryloyloxyethyl)succinate and the like; alicyclic (meth)acrylates such as cyclopentyl (meth)acrylate, cyclohexyl (meth)acrylate, cyclopentyl (meth)acrylate, dicyclopentanyl (meth)acrylate, dicycopentenyl (meth)acrylate, isobornyl (meth)acrylate, mono(2-(meth)acryloyloxyethyl) tetrahydrophthalate, mono(2-(meth)acryloyloxyethyl) hexahydrophthalate and the like; aromatic (meth)acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxypolyethylene glycol (meth)acrylate, nonylphenoxypolyethylene glycol (meth)acrylate, phenoxypolypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, 2-hydroxy-3-(2-naphthoxy)propyl (meth)acrylate and the like; and heterocyclic (meth)acrylates such as 2-tetrahydrofurfuryl (meth)acrylate, N-(meth)acryloyloxyethylhexahydrophthalimide, 2-(meth)acryloyloxyethyl-N-carbazole and the like and caprolactone-modified products thereof. They are raw materials for a repetitive unit (Formula 9) described later.

The other examples of the monomer for forming the component (D) described above include mono(2-(meth)acryloyloxyethyl) succinate, mono(2-(meth)acryloyloxyethyl) phthalate, mono(2-(meth)acryloyloxyethyl) isophthalate, mono(2-(meth)acryloyloxyethyl) terephthalate, mono(2-(meth)acryloyloxyethyl) tetrahydrophthalate, mono(2-(meth)acryloyloxyethyl) hexahydrophthalate, mono(2-(meth)acryloyloxyethyl) hexahydroisophthalate, mono(2-(meth)acryloyloxyethyl) hexahydroterephthalate, ω-carboxy-polycaprolactone mono(meth)acrylate, 3-vinylbenzoic acid, 4-vinylbenzoic acid and the like. They are raw materials for a repetitive unit (Formula 10) described later.

Further, the other examples of the monomer for forming the component (D) described above include compounds having an ethylenically unsaturated group and a hydroxyl group such as 2-hydroxyethyl (meth)acrylate, 2-hydroxypropyl (meth)acrylate, 3-chloro-2-hydroxypropyl (meth)acrylate, 2-hydroxybutyl (meth)acrylate and the like, and they are raw materials for a repetitive unit (Formula 8) described later.

Also, another examples of the monomer for forming the component (D) described above include compounds having an ethylenically unsaturated group and an epoxy group such as glycidyl (meth)acrylate, α-ethylglycidyl (meth)acrylate, α-propylglycidyl (meth)acrylate, α-butylglycidyl (meth)acrylate, 2-methylglycidyl (meth)acrylate, 2-ethylglycidyl (meth)acrylate, 2-propylglycidyl (meth)acrylate, 3,4-expoxybutyl (meth)acrylate, 3,4-epoxyheptyl (meth)acrylate, α-ethyl-6,7-epoxyheptyl (meth)acrylate, 3,4-epoxycyclohexylmethyl (meth)acrylate, o-vinylbenzyl glycidyl ether, m-vinylbenzyl glycidyl ether, m-vinylbenzyl glycidyl ether, p-vinylbenzyl glycidyl ether and the like; compounds having an ethylenically unsaturated group and an oxetanyl group such as (2-ethyl-2-oxetanyl)methyl(meth)acrylate, (2-methyl-2-oxetanyl)methyl (meth)acrylate, 2-(2-ethyl-2-oxetanyl)ethyl (meth)acrylate, 2-(2-methyl-2-oxetanyl)ethyl (meth)acrylate, 3-(2-ethyl-2-oxetanyl)propyl (meth)acrylate, 3-(2-methyl-2-oxetanyl)propyl (meth)acrylate and the like; compounds having an ethylenically unsaturated group and an isocyanate group such as 2-(meth)acryloyloxyethyl isocyanate, 1,1-bis[meth(acryl)oxymethyl]ethyl isocyanate, 2-{[2-meth(acryl)oxy]ethoxy]ethyl isocyanate and the like; and compounds having an ethylenically unsaturated group and a carboxyl group such as (meth)acrylic acid, crotonic acid, cinnamic acid, (2-(meth)acryloyloxyethyl) succinate, 2-phthaloylethyl (meth)acrylate, 2-tetrahydrophthaloylethyl (meth)acrylate, 2-hexahydrophthaloylethyl (meth)acrylate, ω-carboxy-polycaprolactone mono(meth)acrylate, 3-vinylbenzoic acid, 4-vinylbenzoic acid and the like.

Various compounds can be used, as described above, as the component (D) of the present invention. Among them, the vinyl polymers obtained by polymerizing the polymerizable compounds which do not contain a halogen atom, a nitrogen atom and a phosphorus atom are preferred from the viewpoint that the photosensitive resin cured products which are excellent in a high temperature and high humidity reliability and a transparency in a visible light are obtained, and it is more preferably the vinyl polymer obtained by using the polymerizable compound selected from the compounds having an ethylenically unsaturated group and a hydroxyl group, the aliphatic (meth)acrylates and the alicyclic (meth)acrylates. The specific examples thereof include vinyl polymers containing a unit represented by the following Formula (8) as a repetitive unit and further containing units represented by the following Formulas (9) and (10) as a repetitive unit. A compatibility of the vinyl polymer with the polymerizable compound which is the component (A) is maintained by the unit represented by Formula (8) contained by the vinyl polymer in a structure thereof, and therefore the transparent photosensitive resin cured product is obtained.

(8)

In Formula (8), $R_{16}$ to $R_{18}$ each are independently a hydrogen atom or a monovalent organic group having 1 to 20 carbon atoms. Also, $R_{19}$ is an organic group having 1 to 20 carbon atoms.

(9)

In Formula (9), $R_{20}$ to $R_{22}$ each are independently a hydrogen atom or a monovalent organic group having 1 to 20 carbon atoms. Also, $R_{23}$ is an organic group having 1 to 20 carbon atoms.

(10)

In Formula (10), $R_{24}$ to $R_{26}$ each are independently a hydrogen atom or a monovalent organic group having 1 to 20 carbon atoms.

The component (D) is not an essential component, as described above, in the photosensitive resin composition of the present invention, but when the photosensitive resin composition of the present invention is used for a light guiding film, the component (D) is preferably blended. A content thereof is preferably 85% by mass or less based on a total amount of the component (A) and the component (D) in terms of the heat resistant reliability, and it falls in a range of more preferably 30 to 70% by mass from the viewpoint described above.

Also, in addition to the components (A) to (D) described above, so-called additives such as a yellowing inhibitor, a UV ray absorber, a visible light absorber, a colorant, a plasticizer, a stabilizer, a filler, a fluorescent whitening agent and the like may be added, if necessary, to the photosensitive resin composition of the present invention in proportions in which an adverse effect is not exerted on the effects of the present invention.

The photosensitive resin composition of the present invention can be used for a photosensitive resin varnish, and particularly when the component (A) is used as a principal component without blending the component (D) described above, the resin composition can be turned into the varnish without using a solvent.

On the other hand, when blended with the component (D), the resin composition may be diluted, if necessary, with a suitable organic solvent and used as the photosensitive resin varnish. The organic solvent used above shall not specifically be restricted as long as it can dissolve the above resin composition, and it includes, for example, cyclic ethers such as tetrahydrofuran, 1,4-dioxane and the like; alcohols such as methanol, ethanol, isopropanol, butanol, ethylene glycol, propylene glycol and the like; ketones such as acetone, methyl ethyl ketone, methyl isobutyl ketone, cyclohexanone, 4-hydroxy-4-methyl-2-pentanone and the like; esters such as methyl acetate, ethyl acetate e, butyl acetate, methyl lactate, ethyl lactate, γ-butyrolactone and the like; carbonic esters such as ethylene carbonate, propylene carbonate and the like; polyhydric alcohol alkyl ethers such as ethylene glycol monomethyl ether, ethylene glycol monoethyl ether, ethylene glycol monobutyl ether, ethylene glycol dimethyl ether, ethylene glycol diethyl ether, propylene glycol monomethyl ether, propylene glycol monoethyl ether, propylene glycol dimethyl ether, propylene glycol diethyl ether, diethylene glycol monomethyl ether, diethylene glycol monoethyl ether, diethylene glycol monobutyl ether, diethylene glycol dimethyl ether, diethylene glycol diethyl ether and the like; polyhydric alcohol alkyl ether acetates such as ethylene glycol monomethyl ether acetate, ethylene glycol monoethyl ether acetate, ethylene glycol monobutyl ether acetate, propylene glycol monomethyl ether acetate, propylene glycol monoethyl ether acetate, diethylene glycol monomethyl ether acetate, diethylene glycol monoethyl ether acetate and the like; amides such as N,N-dimethylformamide, N,N-dimethylacetamide, N-methylpyrrolidone and the like. No aromatic solvents are preferably used from the viewpoint of a heat resistant reliability of the above resin composition.

Among them, preferred from the viewpoints of a solubility and a boiling point are methanol, ethanol, isopropanol, acetone, methyl ethyl ketone, methyl isobutyl ketone, cyclohexanone, methyl acetate, ethyl acetate, butyl acetate, methyl lactate, ethyl lactate, ethylene glycol monomethyl ether, ethylene glycol monoethyl ether, propylene glycol monomethyl ether, propylene glycol monoethyl ether, diethylene glycol dimethyl ether, ethylene glycol monomethyl ether acetate, propylene glycol monomethyl ether acetate and N,N-dimethylacetamide.

The above organic solvents can be used alone or in combination of two or more kinds thereof.

Also, a solid matter concentration in the resin varnish is preferably 20 to 80% by mass.

When preparing the photosensitive resin varnish, the components are mixed preferably by stirring. The stirring method shall not specifically be restricted, and the stirring is carried out preferably by using a propeller from the viewpoint of a stirring efficiency. A rotation speed of the propeller in the stirring shall not specifically be restricted, and it is preferably 10 to 1,000 $\text{min}^{-1}$. If it is 10 $\text{min}^{-1}$ or more, the respective components of the components (A) to (D) and the organic solvent are sufficiently mixed, and if it is 1,000 $\text{min}^{-1}$ or less, engulfing of air bubbles by rotation of the propeller is decreased. From the above viewpoints, a rotation speed thereof is more preferably 50 to 800 $\text{min}^{-1}$, further preferably 100 to 500 $\text{min}^{-1}$.

The stirring time shall not specifically be restricted as well, and it is preferably 1 to 24 hours. If it is 1 hour or longer, the respective components of the components (A) to (D) and the organic solvent are sufficiently mixed. If it is 24 hours or shorter, time for preparing the varnish can be shortened, and the sufficiently high productivity is obtained.

The photosensitive resin varnish prepared is filtrated preferably by using a filter having a pore diameter of 50 μm or less. Use of the filter having a pore diameter of 50 μm or less allows large foreign matters to be removed, prevents cissing from being caused in coating the varnish and inhibits light propagating through the photosensitive resin cured product from being scattered. From the above viewpoints, the filtration is carried out more preferably by using a filter having a pore diameter of 30 μm or less, and it is carried out further preferably by using a filter having a pore diameter of 10 μm or less.

The photosensitive resin varnish prepared is defoamed preferably under reduced pressure. A defoaming method therefor shall not specifically be restricted, and a vacuum pump and a bell jar and a defoaming apparatus equipped with a vacuum device can be used as a specific example thereof. The pressure reducing degree in the pressure reduction shall not specifically be restricted, and it falls preferably in a range in which the organic solvent contained in the resin varnish is not boiled. The vacuum defoaming time shall not specifically be restricted, and it is preferably 3 to 60 minutes. If it is 3 minutes or longer, air bubbles dissolved in the resin varnish can be removed. If it is 60 minutes or shorter, the organic solvent contained in the resin varnish is prevented from being volatilized.

The photosensitive resin composition of the present invention can quickly be cured by light containing a UV ray. In this regard, assuming that a reaction rate of the cured product obtained at a thickness of 0.5 mm and a light dose of 3000 $\text{mJ/cm}^2$ is 100%, a reaction rate thereof in irradiation at 100 $\text{mJ/cm}^2$ is preferably 80% or more. Use of the above material makes it possible to obtain a material which provides a molded product at an excellent productivity.

A light source for generating a UV ray shall not specifically be restricted, and it includes, in addition to mercury lamps such as a low pressure mercury lamp, a high pressure mercury lamp, an ultrahigh pressure mercury lamp and the like, a tungsten lamp, a xenon lamp, a gas laser, a semiconductor laser and the like. The irradiation dose required for curing is varied according to a thickness and a refractive index of the cured product required, and the cured product can be obtained usually by irradiating with light of 10 to 10000 $\text{mJ/cm}^2$ at an illuminance of 1 to 500 $\text{mW/cm}^2$.

The cured product obtained has preferably a light transmittance of 90% or more in a visible light region of 400 to 780 nm in a test piece having a thickness of 1 mm. Use of the above cured product makes it possible to propagate light without reducing an illuminance of light and changing a color of the light source. If a light transmittance thereof is lower than 90%, light can not sufficiently be propagated or it is propagated with a color of the light source being changed, and therefore it is not preferred.

The photosensitive resin film of the present invention shall be explained below.

The photosensitive resin film of the present invention comprises the photosensitive resin composition described above and can readily be produced by coating the photosensitive resin varnish containing the components (A) to (C) and the component (D) added if necessary on a suitable base film and removing the solvent to form a photosensitive resin layer (hereinafter referred to merely as "the resin layer"). Further, it may be produced by coating the photosensitive resin composition directly on the base film without turning the resin composition into a varnish.

The base film shall not specifically be restricted, and it includes, for example, polyesters such as polyethylene terephthalate, polybutylene terephthalate, polyethylene naphthalate and the like; polyolefins such as polyethylene, polypropylene, polyethylene-vinyl acetate copolymers and the like; polyvinyl chloride, polyvinylidene chloride, polycarbonate, polyamide, polyimide, polyamideimide, polyetherimide, polyether sulfide, polyethersulfone, polyetherketone, polyphenyleneether, polyphenylene sulfide, polyallylate, polysulfone, liquid crystal polymers and the like.

Among them, the base film is preferably polyethylene terephthalate, polybutylene terephthalate, polyethylene naphthalate, polypropylene, polyethylene-vinyl acetate copolymers, polycarbonate, polyamide, polyimide, polyamideimide, polyphenyleneether, polyphenylene sulfide, polyallylate and polysulfone from the viewpoints of a flexibility and a toughness.

A thickness of the base film may suitably be changed according to a targeted flexibility thereof, and it is preferably 3 to 250 μm. If it is 3 μm or more, a strength of the film is sufficiently high, and if it is 250 μm or less, the satisfactory flexibility is obtained. From the above viewpoints, it is more preferably 5 to 200 μm, further preferably 7 to 150 μm. From the viewpoint of enhancing a peeling property thereof from the resin layer, a film subjected to peeling treatment by a silicone base compound, a fluorine-containing compound and the like may be used if necessary.

In the photosensitive resin film produced by coating the photosensitive resin varnish or the photosensitive resin composition on the base film, a protective film may be stuck, if necessary, on the resin layer to introduce a three layer structure of the base film, the resin layer comprising the photosensitive resin composition or the photosensitive resin cured product and the protective film.

The protective film shall not specifically be restricted, and it includes, for example, polyesters such as polyethylene terephthalate, polybutylene terephthalate, polyethylene naphthalate and the like; and polyolefins such as polyethylene, polypropylene and the like. Among them, it is preferably polyesters such as polyethylene terephthalate and the like and polyolefins such as polyethylene, polypropylene and the like from the viewpoints of a flexibility and a toughness. From the viewpoint of enhancing a peeling property thereof from the resin layer, a film subjected to peeling treatment by a silicone base compound, a fluorine-containing compound and the like may be used if necessary.

A thickness of the protective film may suitably be changed according to a targeted flexibility thereof, and it is preferably 10 to 250 μm. If it is 10 μm or more, a strength of the film is sufficiently high, and if it is 250 μm or less, the satisfactory flexibility is obtained. From the above viewpoints, it is more preferably 15 to 200 μm, further preferably 20 to 150 μm.

A thickness of the resin layer in the photosensitive resin film of the present invention shall not specifically be restricted, and usually it is preferably 5 to 500 μm in terms of a thickness after dried. If it is 5 μm or more, a thickness of the film is sufficiently large, and therefore a strength of the resin film or the cured product of the above resin film is sufficiently high. If it is 500 μm or less, an amount of the solvent remaining in the resin film is not increased since drying can sufficiently be carried out, and the cured product of the above film does not cause foaming when it is heated.

The photosensitive resin film thus obtained can readily be stored by winding up in a roll form. Alternatively, the film of a roll form can be cut out in a suitable size to store it in a sheet form.

The photosensitive resin composition can be subjected to curing reaction or polymerization reaction by light, heat or the like to obtain a cured product. In the above case, the resin composition is turned in advance into an optional form such as a sheet, a film, a strip and the like and then subjected to curing reaction or the like, whereby a cured product having an optional form can be obtained as well. The cured product thus obtained can be used as a device for illumination by using in an air cladding as is the case with ordinary optical waveguides.

Also, the photosensitive resin composition of the present invention can be processed into an optional form by a cast molding method, an imprint method, a stamp method and a transfer method.

A ratio ($Int_{460}/Int_{560}$) of a transmitted light intensity in the vicinity of 460 nm to a transmitted light intensity in the vicinity of 560 nm in irradiating the cured product obtained by subjecting the photosensitive resin composition to curing reaction with a white LED light is preferably 1.0 to 4.0. If the above ratio is 1.0 or more, transmitted light is approximate to the light emitted from the original light source, and it can be a device suited to illumination use. On the other hand, the above ratio of 4.0 or more is realistically impossible. From the above viewpoints, a ratio of the transmitted light intensities described above falls in a range of more preferably 1.5 to 4.0. In this connection, $Int_{460}$ is an intensity of a peak originating principally in a B band observed in the vicinity of 460 nm, and $Int_{560}$ is an intensity of a peak originating principally in a mixed light of a G band and a R band each observed in the vicinity of 560 nm.

EXAMPLES

The examples of the present invention shall be specifically explained below, but the present invention shall not be restricted to these examples.

Evaluation Methods:

(1) Measurement of Sulfuric Acid Ion Content:

The photosensitive resin composition 1 g was put in a sample bottle, and 10 g of water was added thereto and stirred one night. The aqueous layer part was filtrated through a membrane filter, and the filtrate was used for quantitatively determining a sulfuric acid ion content thereof by an ion chromatography.

Figure 1:
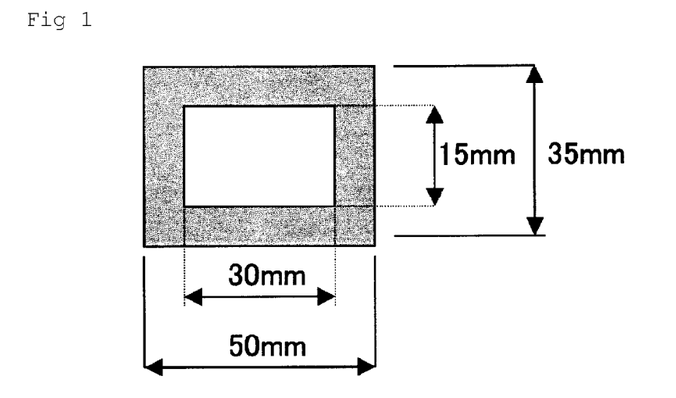
FIG. 1 is a drawing showing a framework for preparing a test piece.

(2) Preparation of Test Piece:

A silicone sheet having a thickness of 1 mm was used to prepare a framework for mold casting having a form shown in FIG. 1. Further, a silicone sheet having a thickness of 0.5 mm was used separately to prepare frameworks for mold casting having forms shown in FIG. 2 and FIG. 3.

Next, the frameworks were put on a glass plate so that air bubbles were not introduced therein and closely adhered thereon. The photosensitive resin compositions prepared in the examples and the comparative examples were injected thereinto, and they were coated calmly with glass plates. A UV ray was radiated from an upper part of the above glass plates by means of a UV ray exposing equipment (trade name: MAP-1200-L, manufactured by Dainippon Screen Mfg. Co., Ltd.) to obtain optically cured products. An exposure value was set to 3000 mJ/cm$^2$ when the framework shown in FIG. 1 was used and 300 mJ/cm$^2$ when the framework shown in FIG. 2 was used. The test pieces thus obtained were used for various measurements.

Figure 3:
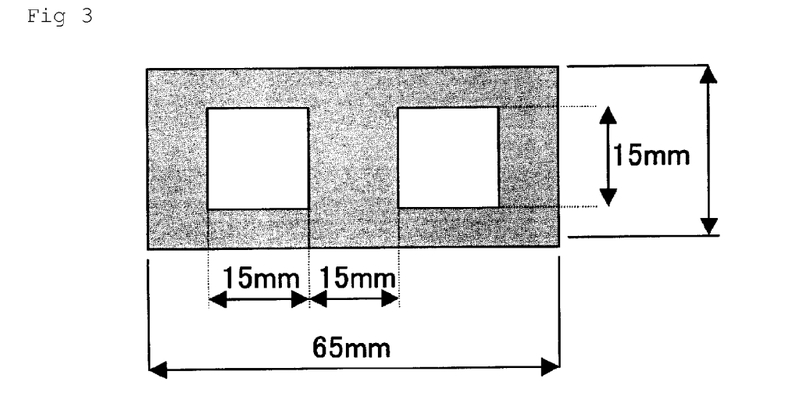
FIG. 3 is a drawing showing a framework for preparing a test piece.

(3) UV Curing Property:

Used were two kinds of different optically cured products prepared at the UV irradiation doses of 100 mJ/cm$^2$ and 3000 mJ/cm$^2$ by using the framework shown in FIG. 3. FT-IR FTS-6000 manufactured by Bio-Rad Laboratories, Inc. was equipped with a Golden Gate Diamond ATR device manufactured by Specac Limited, and the photosensitive resin compositions and the cured products prepared at the UV irradiation doses of 300 mJ/cm$^2$ and 3000 mJ/cm$^2$ were measured respectively. It was calculated from a peak originating in CH out-of-plane deformation vibration of a vinyl group observed in 808 cm$^{-1}$ according to the following equation, wherein a peak originating in aromatic CH out-of-plane deformation vibration observed in 830 cm$^{-1}$ was set to an internal standard:

$$\text{Reaction rate}=[1-(I-I_c)/(I_0-I_c)]\times 100\%$$

I: peak intensity at an irradiation dose of 100 mJ/cm$^2$
$I_c$: peak intensity at an irradiation dose of 3000 mJ/cm$^2$
$I_0$: peak intensity at an irradiation dose of 0 mJ/cm$^2$ (before cured)

The evaluation criteria are shown below:
◎: reaction rate is 99 to 100%
○: reaction rate is more than 90% to less than 99%
Δ: reaction rate is 80 to 90%
X: reaction rate is less than 80%

(4) Transmittance:

The cured product having a thickness of 1 mm which was obtained by using the framework shown in FIG. 1 was used. A spectrophotometer U-3310 manufactured by Hitachi, Ltd. was used to measured the transmittance at a measuring wavelength of 200 to 800 nm. The transmittances in three wavelengths of 420 nm, 560 nm and 780 nm were evaluated.

Figure 2:
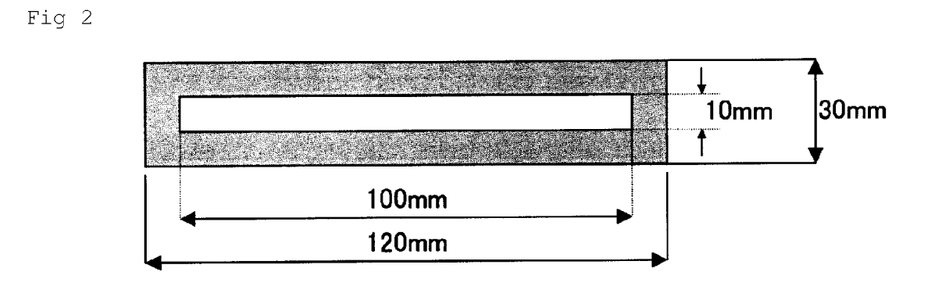
FIG. 2 is a drawing showing a framework for preparing a test piece.

(5) White LED Transmission Intensity:

The cured product having a thickness of 0.5 mm which was obtained by using the framework shown in FIG. 2 was used. A side emission type white LED was used for a light source and emitted at an input current of 15 mA. The cured product was put thereon, and a white LED light (transmission intensity ratio of the light source=4.2) was input from an end face of the cured product. A spectrum of the transmitted light coming out from an end face of an opposite side thereof was measured by means of a multi photometiric system MCPD-3000 manufactured by Otsuka Electronics Co., Ltd., and the transmission intensity ratio was calculated from the peak intensities of the output light according to the following equation:

$$\text{Transmission intensity ratio}=(Int_{460}/Int_{560})$$

$Int_{460}$: an intensity of a peak originating principally in a B band observed in the vicinity of 460 nm $Int_{560}$: an intensity of a peak originating principally in a mixed light of a G band and a R band each observed in the vicinity of 560 nm The evaluation criteria are shown below:
◉: transmission intensity ratio: more than 2.0
○: transmission intensity ratio: 1.5 to 2.0
X: transmission intensity ratio: less than 1.5

(6) Heat Resistant Reliability:

The test piece evaluated in the item (5) described above was put in an oven of 85° C. It was taken out after 500 hours, and a white LED transmission intensity thereof was measured by the method used in the item (5).

Example 1

A brownish red plastic bottle having a capacity of 200 mL was charged with 70.0 g of FA-324A (trade name, EO-modified bisphenol A diacrylate, average EO chain length=4, manufactured by Hitachi Chemical Co., Ltd.), 15.0 g of FA-321A (trade name, EO-modified bisphenol A diacrylate, average EO chain length=10, manufactured by Hitachi Chemical Co., Ltd.), 15.0 g of HEA (trade name, 2-hydroxyethyl acrylate, manufactured by Nippon Shokubai Co., Ltd.), 0.1 g of IRGACURE 754 (trade name, mixture of 2-[2-oxo-2-phenylacetoxyethoxy]ethyl oxyphenylacetate and 2-(2-hydroxyethoxy)ethyl oxyphenylacetate, manufactured by Ciba Japan Co., Ltd.), 0.1 g of DAROCURE TPO (trade name, 2,4,6-trimethylbenzoyl-diphenylphosphine oxide, manufactured by Ciba Japan Co., Ltd.) and 0.1 g of ADK STAB AO-80 (trade name, hindered phenol base antioxidant, manufactured by ADEKA Corporation), and the mixture was stirred at room temperature for 12 hours by means of a mix rotor. The mixture thus obtained was filtrated through a membrane filter having a pore diameter of 2 μm under applied pressure on the conditions of a temperature of 25° C. and a pressure of 0.4 MPa, and the filtrated matter was subjected to vacuum deaeration at 10 mmHg to obtain a photosensitive resin composition.

Examples 2 to 17 and Comparative Examples 1 to 6

Resin compositions were obtained in the same manner as in Example 1, except that they were prepared in compositions shown in Table 1. They were evaluated by the same methods as in Example 1, and the results thereof are shown in Table 1.

TABLE 1

| | | | Example | | | | | | | | | | | | | |
|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 |
| Component (A) | A-a[1] | | 70 | 70 | 70 | 70 | 70 | 70 | 70 | 70 | 70 | 70 | 70 | 70 | 70 |
| | A-b[2] | | 15 | 15 | 15 | 15 | 15 | 15 | 15 | 15 | 15 | 15 | 15 | 15 | 15 |
| | A-c[3] | | — | — | — | — | — | — | — | — | — | — | — | — | — |
| | A-d[4] | | 15 | 15 | 15 | 15 | 15 | 15 | — | 15 | 15 | 15 | 15 | 15 | 15 |
| | A-e[5] | | — | — | — | — | — | — | 15 | — | — | — | — | — | — |
| Component (B) | Component (B-1) | B-a[6] | 0.1 | — | — | — | 0.1 | 0.1 | 0.1 | 0 | 0.1 | 0.3 | 0.1 | 0.1 | 0.1 |
| | | B-b[7] | — | 0.1 | — | — | — | — | — | — | — | — | — | — | — |
| | | B-c[8] | — | — | 0.1 | — | — | — | — | — | — | — | — | — | — |
| | | B-d[9] | — | — | — | 0.1 | — | — | — | — | — | — | — | — | — |
| | Component (B-2) | B-e[10] | 0.1 | 0.1 | 0.1 | 0.1 | — | 0.1 | 0.1 | 0.1 | 0.1 | 0.1 | 0 | 0.1 | 0.2 |
| | | B-f[11] | — | — | — | — | 0.1 | — | — | — | — | — | — | — | — |
| | Aminoacetophenone base[12] | | — | — | — | — | — | — | — | — | — | — | — | — | — |
| | Benzyl ketal base[13] | | — | — | — | — | — | — | — | — | — | — | — | — | — |
| | Oxime ester base[14] | | — | — | — | — | — | — | — | — | — | — | — | — | — |
| Component (C) | C-a[15] | | 0.1 | 0.1 | 0.1 | 0.1 | 0.1 | — | 0.1 | 0.1 | 0.1 | 0.1 | 0.1 | 0.1 | 0.1 |
| | C-b[16] | | — | — | — | — | — | 0.1 | — | — | — | — | — | — | — |
| | C-c[17] | | — | — | — | — | — | — | — | — | — | — | — | — | — |
| Evaluation results | Sulfuric acid ion (ppm by mass) | | <10 | <10 | <10 | <10 | <10 | <10 | <10 | <10 | <10 | <10 | <10 | <10 | <10 |
| | Curing property | | ◉ | ◉ | ◉ | ◉ | ◉ | ◉ | ○ | ◉ | ◉ | ○ | ◉ | ◉ | ◉ |
| | Transmittance | 420 nm | 92 | 91 | 91 | 91 | 90 | 90 | 90 | 92 | 92 | 90 | 92 | 92 | 90 |
| | | 560 nm | 92 | 91 | 91 | 91 | 92 | 92 | 91 | 92 | 92 | 92 | 92 | 92 | 92 |
| | | 780 nm | 92 | 91 | 91 | 91 | 92 | 92 | 91 | 92 | 92 | 92 | 92 | 92 | 92 |
| | Transmission intensity ratio | Before heat resistant test | ◉ | ◉ | ◉ | ◉ | ○ | ◉ | ◉ | ◉ | ◉ | ◉ | ◉ | ◉ | ○ |
| | | After heat resistant test | ◉ | ○ | ○ | ○ | ○ | ◉ | ○ | ◉ | ◉ | ○ | ◉ | ◉ | ○ |

| | | | Example | | | | Comparative Example | | | | | |
|---|---|---|---|---|---|---|---|---|---|---|---|---|
| | | | 14 | 15 | 16 | 17 | 1 | 2 | 3 | 4 | 5 | 6 |
| Component (A) | A-a[1] | | 70 | 70 | 70 | 85 | 70 | 70 | 70 | 70 | 70 | 70 |
| | A-b[2] | | 15 | 15 | 15 | 15 | 15 | 15 | 15 | 15 | 15 | 15 |
| | A-c[3] | | — | — | — | — | — | — | 15 | — | — | — |
| | A-d[4] | | 15 | 15 | 15 | — | 15 | 15 | — | 15 | 15 | 15 |
| | A-e[5] | | — | — | — | — | — | — | — | — | — | — |
| Component (B) | Component (B-1) | B-a[6] | 0.1 | 0.1 | 0.1 | 0.1 | — | — | — | 0.2 | 0.1 | 0.1 |
| | | B-b[7] | — | — | — | — | — | — | — | — | — | — |
| | | B-c[8] | — | — | — | — | — | — | — | — | — | — |
| | | B-d[9] | — | — | — | — | — | — | — | — | — | — |

TABLE 1-continued

|  |  |  | | | | | | | | | | |
|---|---|---|---|---|---|---|---|---|---|---|---|---|
| | Component (B-2) | B-e[10] | 0.1 | 0.1 | 0.1 | 0.1 | 0.1 | 0.1 | 0.1 | — | 0.1 | 0.1 |
| | | B-f[11] | — | — | — | — | — | — | — | — | — | — |
| | | Aminoacetophenone base[12] | — | — | — | — | 0.1 | — | — | — | — | — |
| | | Benzyl ketal base[13] | — | — | — | — | — | 0.1 | — | — | — | — |
| | | Oxime ester base[14] | — | — | — | — | — | — | 0.1 | — | — | — |
| Component (C) | | C-a[15] | 0.1 | 0.5 | 1 | 0.1 | 0.1 | 0.1 | 0.1 | 0.1 | — | — |
| | | C-b[16] | — | — | — | — | — | — | — | — | — | — |
| | | C-c[17] | — | — | — | — | — | — | — | — | 0.1 | — |
| Evaluation results | Sulfuric acid ion (ppm by mass) | | <10 | <10 | <10 | <10 | <10 | <10 | <10 | <10 | <10 | <10 |
| | Curing property | | ◎ | ◎ | ○ | ○ | ○ | ○ | ○ | X | X | ○ |
| | Transmittance | 420 nm | 92 | 92 | 91 | 91 | 60 | 55 | 52 | 92 | 91 | 92 |
| | | 560 nm | 92 | 92 | 90 | 91 | 88 | 85 | 84 | 92 | 91 | 92 |
| | | 780 nm | 92 | 91 | 90 | 91 | 91 | 91 | 91 | 92 | 91 | 92 |
| | Transmission intensity ratio | Before heat resistant test | ◎ | ◎ | ○ | ◎ | X | X | X | ○ | ○ | ○ |
| | | After heat resistant test | ○ | ○ | ○ | ◎ | X | X | X | ○ | ○ | X |

[1] A-a: EO-modified bisphenol A diacrylate (average EO chain length = 4), manufactured by Hitachi Chemical Co., Ltd., FA-324A (trade name)
[2] A-b: EO-modified bisphenol A diacrylate (average EO chain length = 10), manufactured by Hitachi Chemical Co., Ltd., FA-321A (trade name)
[3] A-c: EO-modified bisphenol A diacrylate (average EO chain length = 6), manufactured by Shin-Nakamura Chemical Co., Ltd., A-BPE-6 (trade name)
[4] A-d: 2-hydroxyethyl acrylate, manufactured by Nippon Shokubai Co., Ltd., HEA (trade name)
[5] A-e: tetrahydrofurfuryl acrylate, manufactured by Nippon Shokubai Co., Ltd., Viscoat 150 (trade name)
[6] B-a: mixture of 2-[2-oxo-2-phenylacetoxyethoxy]ethyl oxyphenylacetate and 2-(2-hydroxyethoxy)ethyl oxyphenylacetate, manufactured by Ciba Japan Co., Ltd., IRGACURE 754 (trade name) (glyoxy ester base photoinitiator)
[7] B-b: 1-hydroxycyclohexylbenzophenone, manufactured by Ciba Japan Co., Ltd., IRGACURE 184 (trade name) (α-hydroxyacetophenone base photoinitiator)
[8] B-c: 2-hydroxy-2-methyl-1-phenylpropane-1-one, manufactured by Ciba Japan Co., Ltd., DAROCUR 1173 (trade name) (α-hydroxyacetophenone base photoinitiator)
[9] B-d: 2-hydroxy-1-[4-[4-(2-hydroxy-3,5,2-methylpropionyl)-benzyl]-phenyl]-2-methylpropane-1-one, manufactured by Ciba Japan Co., Ltd., IRGACURE 127 (trade name) (α-hydroxyacetophenone base photoinitiator)
[10] B-e: 2,4,6-trimethylbenzoyl-phenylphosphine oxide, manufactured by Ciba Japan Co., Ltd., DAROCUR TPO (trade name) (phosphine oxide base photoinitiator)
[11] B-f: bis(2,4,6-trimethylbenzoyl)-phenylphosphine oxide, manufactured by Ciba Japan Co., Ltd., IRGACURE 819 (trade name) (phosphine oxide base photoinitiator)
[12] Aminoacetophenone base: 2-methyl-1-[4-(methylthio)phenyl]-2-morpholinopropane-1-one, manufactured by Ciba Japan Co., Ltd., IRGACURE 907 (trade name) (aminoacetophenone base photoinitiator)
[13] Benzyl ketal base: 2,2-dimethoxy-1,2-diphenylethane-1-one, manufactured by Ciba Japan Co., Ltd., IRGACURE 651 (trade name) (benzyl ketal base photoinitiator)
[14] Oxime ester base: 1,2-octanedione-1-[4-(phenylthio)-2-(O-benzoyloxime)], manufactured by Ciba Japan Co., Ltd., IRGACURE OXE01 (trade name) (oxime ester base photoinitiator)
[15] C-a: 3,9-bis[2-[3-(3-t-butyl-4-hydroxy-5-methylphenyl)propionyloxy]-1,1-dimethylethyl]-2,4,8,10-tetraoxaspiro[5.5]undecane, manufactured by ADEKA Corporation, ADK STAB AO-80 (trade name)
[16] C-b: 1,2-bis[2-[3-(3-t-butyl-4-hydroxy-5-methylphenyl)propionyloxy]ethoxy]ethane, manufactured by ADEKA Corporation, ADK STAB AO-70 (trade name)
[17] C-c: pentaerythrityl•tetrakis[3-(3,5-di-t-butyl-4-hydroxyphenyl)propionate], manufactured by Ciba Japan Co., Ltd., IRGANOX 1010 (trade name)

It was found from the results obtained in Examples 1 to 16 that any of the photosensitive resin compositions of the present invention had an excellent transparency and could quickly be cured by a UV ray and that they maintained a transparency after the heat resistant reliability test. Among them, the photosensitive resin compositions prepared by using the mixture of 2-[2-oxo-2-phenylacetoxyethoxy]ethyl oxyphenylacetate and 2-(2-hydroxyethoxy)ethyl oxyphenylacetate as the component (B) and using 2,4,6-trimethylbenzoyl-phenylphosphine oxide as the component (C) in combination had particularly excellent characteristics.

On the other hand, it was found from the results obtained in Comparative Examples 1 to 3 that when the photoinitiators which did not correspond to any of the α-hydroxyacetophenone base photoinitiator and the glyoxy ester base photoinitiator were used as the component (B-1), the photosensitive resin compositions were colored in the initial stage and inferior in a transparency. Further, in Comparative Example 4 in which the component (B-2) was not contained, curing was not sufficiently promoted by UV. Also, it was apparent from the results obtained in Comparative Example 5 that the hindered phenol base heat stabilizer having a di-t-butyl group on the same aromatic ring which was added as the component (C) was reduced in a curing property to a large extent. Further, it was found from the results obtained in Comparative Example 6 that the photosensitive resin composition which did not contain the component (C) was inferior in a heat resistant reliability to a large extent.

Also, it was found from the results obtained in Example 17 that the compound having at least one selected from a hydroxyl group and a tetrahydrofurfuryl group in a molecule showed an excellent curing property.

As shown above, the present invention makes it possible to provide the photosensitive resin composition having a good propagation loss in a visible light region, the photosensitive resin varnish, the photosensitive resin film and the photosensitive resin cured product.

INDUSTRIAL APPLICABILITY

The photosensitive resin compositions of the present invention is a photosensitive resin composition capable of being quickly cured by light and providing an optically cured product which is excellent in a transparency in a visible light region of 400 to 780 nm and a heat resistant reliability, and a cured product thereof can be obtained. Accordingly, it is most suitable to uses such as optical waveguides, light guiding materials and the like, and since it can quickly be cured by light, optical waveguides, light guiding materials and the like can be produced from it at a high productivity.

What is claimed is:
1. A photosensitive resin composition comprising (A) a polymerizable compound, (B) a polymerization initiator and (C) a hindered phenol base antioxidant, wherein (B-1) a glyoxy ester base photoinitiator and (B-2) a phosphine oxide base photoinitiator are contained as the component (B); the component (C) is a hindered phenol base antioxidant having in a molecule, at least one phenol group having each one group of a methyl group and a t-butyl group on the same aromatic ring; a content of the component (B) is 0.02 to 4.0 parts by mass based on 100 parts by mass of the component (A); and a content of the component (C) is 0.01 to 1 part by mass based on 100 parts by mass of the component (A).

2. The photosensitive resin composition according to claim 1, wherein the component (B-1) is at least one selected from 2-[2-oxo-2-phenylacetoxyethoxy]ethyl oxyphenylacetate and 2-(2-hydroxyethoxy)ethyl oxyphenylacetate.

3. The photosensitive resin composition according to claim 1, wherein the component (B-2) is 2,4,6-trimethylbenzoyl-diphenylphosphine oxide.

4. The photosensitive resin composition according to claim 1, wherein the hindered phenol base antioxidant (C) is represented by the following Formula (1):

(1)

(X is any of:

and

).

5. The photosensitive resin composition according to claim 1, wherein the component (A) is a compound having in a molecule, at least one functional group which can be subjected to chain polymerization.

6. The photosensitive resin composition according to claim 5, wherein the functional group which is contained in the component (A) and which can be subjected to chain polymerization is an ethylenically unsaturated group.

7. The photosensitive resin composition according to claim 1, wherein a multifunctional polymerizable compound is contained in the component (A).

8. The photosensitive resin composition according to claim 1, wherein a compound represented by the following Formula (2) or (4) is contained in the component (A):

(2)

(in Formula (2), $R_1$ and $R_2$ each are a hydrogen atom or methyl, and $R_3$ is a group represented by the following Formula (3):

(3)

(in Formula (3), a+b falls in a range of 2 to 50; $R_4$ and $R_5$ each are a hydrogen atom or methyl; and $R_6$ is any of divalent groups represented by the following formulas:

(4)

(in Formula (4), $R_7$ and $R_8$ each are a hydrogen atom or methyl, and $R_9$ is a group represented by the following Formula (5), (6) or (7):

(5)

(6)

(7)

(in Formulas (5), (6) and (7), $R_{10}$ to $R_{15}$ each are a hydrogen atom or methyl; c is an average value and falls in a range of 1 to 30; d and e are average values and each fall in a range of 1 to 15; and f, g and h each are average values and fall in a range of 1 to 10).

9. The photosensitive resin composition according to claim 8, wherein a content of sulfuric acid ions contained in the component (A) is 40 ppm by mass or less based on a total amount of the component (A).

10. The photosensitive resin composition according to claim 1, wherein (D) a vinyl polymer having in a molecule, at least one functional group which can be subjected to chain polymerization is further contained; a content of the above component (D) is 15% by mass or less; a content of the component (B) is 0.02 to 4.0 parts by mass based on 100 parts by mass of a total amount of the component (A) and the component (D); and a content of the component (C) is 0.01 to 1.0 part by mass based on 100 parts by mass of a total amount of the component (A) and the component (D).

11. A photosensitive resin varnish characterized by containing the photosensitive resin composition according to claim 1.

12. A photosensitive resin film prepared by coating the photosensitive resin varnish according to claim 11 on a base film and drying it.

13. A photosensitive resin cured product obtained by irradiating the photosensitive resin composition according to claim 1 with a UV ray to cure it.

14. The photosensitive resin cured product according to claim 13, wherein a light transmittance in a test piece having a thickness of 0.2 mm is 90% or more in a visible light region of 420 to 780 nm.

15. The photosensitive resin cured product according to claim 14, wherein a transmission intensity ratio ($Int_{460}/Int_{560}$) determined from a transmitted light intensity peak in the vicinity of 560 nm and a transmitted light intensity peak in the vicinity of 460 nm each observed in irradiating with a white LED light is 1.5 to 4.0.

16. A photosensitive resin cured product obtained by irradiating the photosensitive resin varnish according to claim 11 with a UV ray to cure it.

17. The photosensitive resin cured product according to claim 16, wherein a light transmittance in a test piece having a thickness of 0.2 mm is 90% or more in a visible light region of 420 to 780 nm.

18. A photosensitive resin varnish characterized by containing the photosensitive resin composition according to claim 10.

19. A photosensitive resin film prepared by coating the photosensitive resin varnish according to claim 18 on a base film and drying it.

20. A photosensitive resin cured product obtained by irradiating the photosensitive resin composition according to claim 10 with a UV ray to cure it.

21. The photosensitive resin composition according to claim 1, wherein a content of component (B-1) and a content of component (B-2) respectively are 0.01 to 0.7 part by mass and 0.01 to 0.6 part by mass, each based on 100 parts by mass of the component (A).

* * * * *